United States Patent [19]
Stuhlmiller

[11] Patent Number: 5,502,413
[45] Date of Patent: Mar. 26, 1996

[54] SWITCHABLE CONSTANT GAIN SUMMING CIRCUIT

[75] Inventor: Gary L. Stuhlmiller, Chandler, Ariz.

[73] Assignee: Motorola, Inc., Schaumburg, Ill.

[21] Appl. No.: 188,984

[22] Filed: Jan. 31, 1994

[51] Int. Cl.[6] .................................................. G06G 7/42
[52] U.S. Cl. ...................................... 327/361; 327/411
[58] Field of Search ................................ 327/407–413, 327/403–405, 361, 355, 334, 307, 65, 560, 561, 562, 563

[56] References Cited

U.S. PATENT DOCUMENTS

| | | | |
|---|---|---|---|
| 3,638,131 | 1/1972 | Sarkissian | 327/411 |
| 3,982,115 | 9/1976 | Traa | 327/334 |
| 4,897,836 | 1/1990 | Fitzpatrick et al. | 327/407 |
| 5,045,804 | 9/1991 | Sugawara et al. | 327/411 |
| 5,172,017 | 12/1992 | Schmidt | 327/65 |
| 5,196,733 | 3/1993 | Shin | 327/411 |
| 5,331,206 | 7/1994 | Liron | 327/403 |
| 5,334,881 | 8/1994 | Kirkpatrick | 327/407 |

Primary Examiner—Toan Tran
Attorney, Agent, or Firm—Rennie W. Dover

[57] ABSTRACT

A switchable constant gain summer circuit (10) has been provided. The summer circuit selectively amplifies a plurality of input signals while maintaining a constant dc current flowing through a load which maintains a constant gain for the summer circuit. The summer circuit includes a plurality of amplifier circuits (12, 16) being respectively responsive to a plurality of input signals wherein each one of amplifier circuits has a control input and common first and second outputs for respectively providing first and second output signals. A plurality of control means (14, 18) responsive to a plurality of control signals is included for alternately providing first and second voltages to each one of the control inputs of the amplifier circuits. A load circuit (20) is coupled to the common first and second outputs of the amplifier circuits wherein a DC bias through the load circuit is substantially constant. Also, an output stage (22) coupled to the common first and second outputs of the plurality of amplifier circuits is included for respectively providing first and second summed voltages.

5 Claims, 1 Drawing Sheet

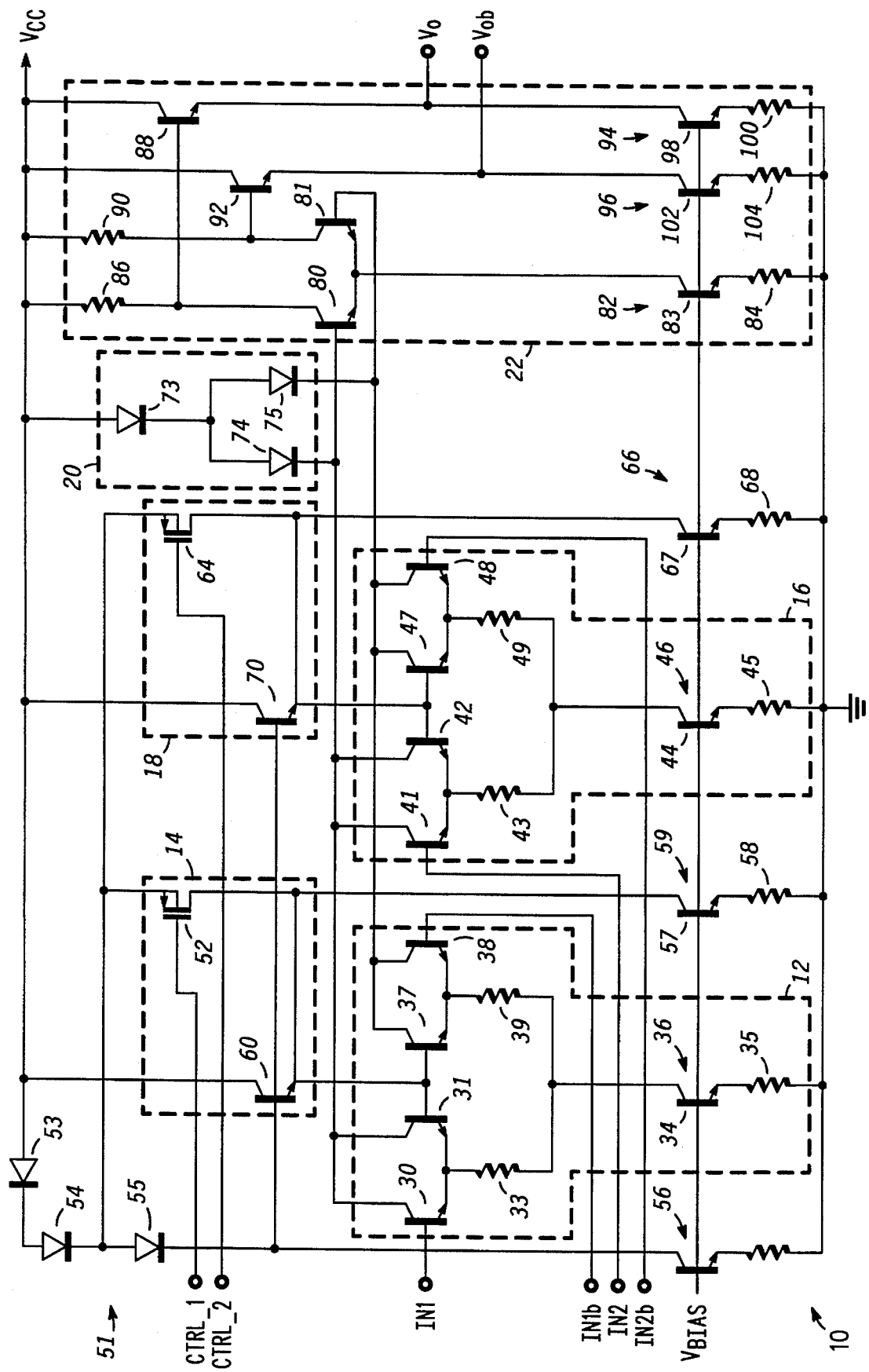

SWITCHABLE CONSTANT GAIN SUMMING CIRCUIT

BACKGROUND OF THE INVENTION

This invention relates, in general, to semiconductor circuits and, more particularly, to a constant gain summing circuit.

Briefly, a constant gain summing circuit is used to accurately produce an output signal that represents the sum of one or more selected input signals. Such a summing circuit may be used in hard disk drive applications which require a tap summing network for a Partial Response, Maximum Likelihood, (PRML) mass storage data recovery channel.

Most, if not all, analog summer circuits are not capable of providing constant gain for each input signal and subsequently providing an accurate summed output signal. Prior summing circuits have had to resort to converting the input signals into digital form and using a digital adder to produce a summed signal. However, this digital form technique typically introduces undesirable clock delays when recovering data.

Hence there exists a need for a constant gain summing circuit that can produce the sum of several analog input signals while providing constant gain for each input signal present.

BRIEF DESCRIPTION OF THE DRAWINGS

The sole FIGURE illustrates a detailed schematic diagram of a switchable constant gain summing circuit in accordance with the present invention.

DETAILED DESCRIPTION OF THE DRAWINGS

Referring to the sole FIGURE, a detailed schematic diagram illustrating switchable constant gain summer 10 is shown. Summer circuit 10 includes amplifier circuit 12 having first and second inputs for receiving differential signals IN1 and IN1b and a control input coupled to control circuit 14, wherein control circuit 14 is responsive to a first control signal CTRL_1.

Summer circuit 10 also includes amplifier circuit 16 having first and second inputs for receiving differential input signals IN2 and IN2b and a control input coupled to control circuit 18 wherein control circuit 18 is responsive to a second control signal CTRL_2. Amplifiers 12 and 16 both have common first outputs and common second outputs that are coupled to load circuit 20. Moreover, the common first outputs of amplifiers 12 and 16 are coupled to a first input of output stage 22, while the common second outputs of amplifiers 12 and 16 are coupled to a second input of output stage 22. Output stage 22 further provides first and second output voltages Vo and Vob.

Amplifier circuit 12 includes emitter coupled transistors 30 and 31 each having their emitters coupled through resistor 33 to the collector of transistor 34 the emitter of which is coupled through resistor 35 and returned to ground reference. The base of transistor 34 is coupled to receive a bias voltage $V_{BIAS}$ wherein transistor 34 and resistor 35 form current source 36.

The base of transistor 30 is coupled to receive differential signal IN1 while the base of transistor 31 is coupled to an output of control circuit 14.

Amplifier circuit 12 also includes emitter coupled transistors 37 and 38 each having their emitters coupled through resistor 39 to the collector of transistor 34. The base of transistor 38 is coupled to receive differential signal IN1b while the base of transistor 37 is coupled to the base of transistor 31.

The collectors of transistors 30 and 31 are coupled together to form a first output of amplifier circuit 12. Similarly, the collectors of transistors 37 and 38 are coupled together to form a second output of amplifier circuit 12.

Amplifier circuit 16 includes emitter coupled transistors 41 and 42 each having an emitter coupled through resistor 43 to the collector of transistor 44. The emitter of transistor 44 is coupled through resistor 45 and returned to ground reference. Further, the base of transistor 44 is coupled to receive the bias voltage $V_{BIAS}$ wherein transistor 44 and resistor 45 form current source 46.

The base of transistor 41 is coupled to receive differential signal IN2 while the base of transistor 42 is coupled to the output of control circuit 18.

Amplifier circuit 16 also includes emitter coupled transistors 47 and 48 each having an emitter coupled through resistor 49 to the collector of transistor 44. The base of transistor 48 is coupled to receive differential signal IN2b while the base of transistor 47 is coupled to the base of transistor 42.

The collectors of transistors 41 and 42 are coupled together to form a first output of amplifier circuit 16. Similarly, the collectors of transistors 47 and 48 are coupled together and form a second output of amplifier circuit 16. Moreover, the first output of amplifier circuit 12 is coupled to the first output of amplifier circuit 16. Also, the second output of amplifier circuit 12 is coupled to the second output of amplifier circuit 16. Thus, amplifier circuits 12 and 16 have common first and second outputs as aforementioned.

Control circuit 14 includes transistor 52 having a control electrode coupled to receive control signal CTRL_1. A source electrode of transistor 52 is coupled for receiving a first bias voltage from bias circuit 51 which includes diodes 53–55 and transistor 56. The drain electrode of transistor 52 is coupled through current source 59 and returned to ground reference wherein current source 59 includes transistor 57 and resistor 58.

Control circuit 14 also includes transistor 60 having a collector coupled to a first supply voltage terminal at which the operating potential $V_{CC}$ is applied, and a base coupled to receive a second bias voltage via bias circuit 51. The emitter of transistor 60 is coupled both to the control input of amplifier circuit 12 and to current source 59.

Control circuit 18 includes transistor 64 having a control electrode coupled to receive control signal CTRL_2 and a source electrode coupled to receive the first bias voltage via bias circuit 51. The drain electrode of transistor 64 is coupled through current source 66 and returned to ground reference wherein current source 66 is comprised of transistor 67 and resistor 68. Control circuit 18 also includes transistor 70 having a collector coupled to the first supply voltage terminal and a base coupled to receive the second bias voltage via bias circuit 51. The emitter of transistor 70 is coupled both to the control input of amplifier circuit 16 and to current source 66.

Load circuit 20 includes diodes 73–75 wherein the anode of diode 73 is coupled to the first supply voltage terminal and the cathode of diode 73 is coupled to the anodes of diodes 74 and 75. Further, the cathode of diode 74 is coupled to the common first outputs of amplifiers 12 and 16. Similarly, the cathode of diode 75 is coupled to the common second outputs of amplifier circuits 12 and 16.

Output stage 22 includes emitter coupled transistors 80 and 81 each having their emitters coupled through current source 82 and returned to ground wherein current source 82 incudes transistor 83 and resistor 84. The base of transistor 80 is coupled to the common first outputs of amplifier circuits 12 and 16 while the base of transistor 81 is coupled to the common second outputs of amplifier circuits 12 and 16. The collector of transistor 80 is coupled through resistor 86 to the first supply voltage terminal and to the base of transistor 88. Similarly, the collector of transistor 81 is coupled through resistor 90 to the first supply voltage terminal and to the base of transistor 92.

The collectors of transistors 88 and 92 are coupled to the first supply voltage terminal while the emitters of each are respectively coupled to provide output signals Vo and Vob. Moreover, the emitters of transistors 88 and 92 are respectively coupled through current sources 94 and 96 and returned to ground reference wherein current source 94 includes transistor 98 and resistor 100 and current source 96 includes transistor 102 and resistor 104.

In operation, time varying differential signals IN1 AND IN1$b$ are applied to amplifier circuit 12, time varying signals IN2 and IN2$b$ are applied to amplifier circuit 16. Additionally, control signals Ctrl__1 and Ctrl__2 are respectively applied to control inputs of amplifiers 12 and 16 via control networks 14 and 18.

If signal Ctrl__1 is at a high level, transistor 52 is rendered non-operative. As a result, the collector current of transistor 57 is supplied through the emitter of transistor 60 thereby causing transistor 60 to be rendered operative. The emitter voltage of transistor 60 will be at a voltage level of four diode drops below Vcc via the voltage drops occurring across diodes 53, 54 and 55 and the base-emitter voltage of transistor 60. The dc common mode voltages of inputs IN1, IN1$b$, IN2, IN2$b$ are maintained at three diode drops below Vcc. As a result, transistors 31 and 37 of amplifier circuit 12 are rendered non-operative and, thus, have no collector currents. However, transistors 30 and 38 are rendered operative and their collector currents are representative of the input signals IN1 and IN1$b$, which are respectively applied to their bases, plus a constant dc current which is determined by current source 36.

On the other hand, if control signal Ctrl__1 is at ground, transistor 52 is rendered operative. As a result, the collector current of transistor 57 is supplied through transistor 52. This places the drain voltage of transistor 52 at approximately two diode drops below Vcc via diodes 53 and 54. This voltage renders transistor 60 non-operative and this drain voltage is also provided to the bases of transistors 31 and 37. This voltage is one diode drop above the dc common mode voltage of signals IN1 and IN1$b$ thereby turning off transistors 30 and 38 of amplifier circuit 12. The resultant output current of amplifier circuit 12 then only represents a dc value which is supplied by current source 36 since transistors 30 and 38 are off and do not allow signals IN1 and IN1$b$ to pass to the output of amplifier circuit 12. But note that a constant dc current is maintained at the output of amplifier circuit 12 independent of the whether transistor pair 30 and 38 or transistor pair 31 and 37 are rendered operative. Thus, the output dc current appearing at the output of amplifier circuit 12 is constant and independent of the control voltage applied to the bases of transistors 31 and 37.

In a similar manner, control network 18 controls amplifier circuit 16. For example, if control signal Ctrl__2 is at ground, transistor 64 is rendered operative. As a result, the collector current of transistor 67 is supplied through transistor 64. This places the drain voltage of transistor 64 at approximately two diode drops below Vcc via diodes 53 and 54. This voltage renders transistor 70 non-operative and this drain voltage is also provided to the bases of transistors 42 and 47. This voltage is one diode drop above the dc common mode voltage of signals IN2 and IN2$b$ thereby turning off transistors 41 and 48 of amplifier circuit 16. The resultant output current of amplifier circuit 16 then only represents a dc value which is supplied by current source 46 since transistors 41 and 48 are off and do not allow signals IN2 and IN2$b$ to pass to the output of amplifier circuit 16.

On the other hand, if control signal Ctrl__2 is a high level, transistor 64 is rendered non-operative. As a result, the collector current of transistor 66 is supplied by the emitter of transistor 70. The emitter voltage is at four diode drops below Vcc and also appears at the bases of transistors 42 and 47 of network 16. This voltage is below the dc common mode voltages of transistors 41 and 48 which turns transistors 42 and 47 off. Thus, transistors 42 and 47 no longer supply collector current to the output of amplifier circuit 16. Transistors 41 and 48 are now on and their collector currents will be a dc value plus a value representing the input signals IN2 and IN2$b$.

In summary, the output currents appearing at first and second outputs of amplifiers 12 and 16 are summed together. The summing of the output currents at first and second outputs of amplifier circuits 12 and 16 always include first and second dc components which respectively correspond to the dc currents provided by current sources 36 and 46. Additionally, the first and second outputs of amplifier circuits 12 and 16 may include ac components due to signals IN1, IN1$b$, IN2 and IN2$b$ depending upon the voltage supplied to the control inputs of amplifier circuits 12 and 16.

These respective output currents appearing at first and second outputs of amplifiers 12 and 16 are also coupled to load network 20. The first common outputs are coupled to load diode 74, while the second common output is coupled to diode 75. The voltage drops across the diodes is due to the first and second dc components and to any ac components from signals IN1, IN1$b$, IN2 and IN2$b$. However, it must be understood that the dc value of the current flowing through diode loads 74 and 75 does not change and the load impedance value remains constant. Moreover, this allows the gain of summer circuit 10 to remain constant and independent of whether amplifier circuits 12 and 16 are amplifying differential signals IN1 and IN2, respectively.

This signal across diode loads 74 and 75 is now connected to output stage 22. Output stage 22 linearizes the signal, provides gain and buffers the signal thereby allowing other networks to be driven.

Although only two amplifier circuits have been shown for simplicity, it should be understood that the present invention may be implemented with any number of amplifier circuits (similar to 12 and 16) wherein each would have a respective control network (similar to 14 or 18).

By now it should be apparent from the foregoing disclosure that a novel switchable constant gain summer circuit has been provided. The summer circuit selectively amplifies a plurality of input signals while maintaining a constant dc current flowing through a load which maintains a constant gain for the summer circuit. The summer circuit includes a plurality of amplifier circuits being respectively responsive to a plurality of input signals wherein each one of amplifier circuits has a control input and common first and second outputs for respectively providing first and second output signals. A plurality of control networks responsive to a plurality of control signals is included for alternately providing first and second voltages to each one of the control inputs of the amplifier circuits. A load circuit is coupled to the common first and second outputs of the amplifier circuits wherein a DC bias through the load circuit is substantially constant. Also, an output stage coupled to the common first and second outputs of the plurality of amplifier circuits is included for respectively providing first and second summed voltages.

While the invention has been described in specific embodiments thereof, it is evident that many alterations, modifications and variations will be apparent to those skilled in the art. Further, it is intended to embrace all such alterations, modifications and variations in the appended claims.

I claim:

1. A switchable constant gain summer circuit, comprising:

a plurality of amplifier circuits respectively responsive to a plurality of input signals, each one of said plurality of amplifier circuits having a control input and common first and second outputs for respectively providing first and second output signals, and wherein each one of said plurality of amplifier circuits includes:

first and second emitter coupled transistors, a collector of said first transistor coupled to a collector of said second transistor both of which are coupled to said common first output, a base of said first transistor coupled to receive a first input signal, a base of said second transistor coupled to one of a plurality of control means which alternately provide first and second voltages thereat;

third and fourth emitter coupled transistors, a collector of said third transistor coupled to a collector of said fourth transistor both of which are coupled to said common second output, a base of said third transistor coupled to said base of said second transistor, a base of said fourth transistor coupled for receiving an inversion of said first input signal; and a current source coupled between said emitters of said first, second, third and fourth transistors and a first supply voltage terminal;

said plurality of control means responsive to a plurality of control signals for alternately providing said first and second voltages at corresponding said control inputs of said plurality of amplifier circuits;

a load circuit coupled to said common first and second outputs of said plurality of amplifier circuits wherein a DC current through said load circuit is substantially constant and independent of whether said first or second voltage is applied to said control inputs of said plurality of amplifier circuits; and an output stage having first and second inputs and first and second outputs, said first and second inputs of said output stage respectively coupled to said common first and second outputs of said plurality of amplifier circuits, said first and second outputs of said output stage for respectively providing first and second summed voltages.

2. A switchable constant gain summer circuit, comprising:

a plurality of amplifier circuits respectively responsive to a plurality of input signals, each of said plurality of amplifier circuits having a control input and common first second outputs for respectively providing first and second output signals;

a plurality of control means responsive to a plurality of control signals for alternately providing first and second voltages at corresponding said control inputs of said plurality of amplifier circuits, wherein each one of said plurality of control means includes:

a first transistor having control, first and second current carrying electrodes, said control electrode of said first transistor coupled to receive a first control signal, said first current carrying electrode of said first transistor coupled to receive a first bias voltage;

a second transistor having a collector, a base and an emitter, said collector of said second transistor coupled to a first supply voltage terminal, said base of said second transistor coupled to receive a second bias voltage, said emitter of said second transistor coupled to a control input of a corresponding one of said plurality of amplifier circuits and to said second current carrying electrode of said first transistor; and a current source coupled between said second current carrying electrode of said first transistor and a second supply voltage terminal;

a load circuit coupled to said common first and second outputs of said plurality of amplifier circuits wherein a DC current through said load circuit is substantially constant and independent of whether said first or second voltage is applied to said control inputs of said plurality of amplifier circuits; and an output stage having first and second inputs and first and second outputs, said first and second inputs of said output stage respectively coupled to said common first and second outputs of said plurality of amplifier circuits, said first and second outputs of said output stage for respectively providing first and second summed voltages.

3. A switchable constant gain summer circuit, comprising:

a plurality of amplifier circuits respectively responsive to a plurality of input signals, each of said plurality of amplifier circuits having a control input and common first and second outputs for respectively providing first and second output signals;

a plurality of control means responsive to a plurality of control signals for alternately providing first and second voltages at corresponding said control inputs of said plurality of amplifier circuits;

a load circuit coupled to said common first and second outputs of said plurality of amplifier circuits wherein a DC current through said load circuit is substantially constant and independent of whether said first or second voltage applied to said control inputs of said plurality of amplifier circuits, and wherein said load circuit includes:

a first diode having an anode and a cathode, said anode of said first diode coupled to a first supply voltage terminal;

a second diode having an anode and a cathode, said anode of said second diode coupled to said cathode of said first diode, said cathode of said second diode coupled to said common first outputs of said plurality of amplifier circuits; and a third diode having an anode and a cathode, said anode of said third diode coupled to said cathode of said first diode, said cathode of said third diode coupled to said common second outputs of said plurality of amplifier circuits; and an output stage having first and second inputs and first and second outputs, said first and second inputs of said output stage respectively coupled to said common first second outputs of said plurality of amplifier circuits, said first and second outputs of said output stage for respectively providing first and second summed voltages.

4. The switchable constant gain summer circuit according to claim 1 wherein said output stage includes:

first and second emitter coupled transistors, a base of said first transistor coupled to said common first outputs of said plurality of amplifier circuits, a base of said second transistor coupled to said common second outputs of said plurality of amplifier circuits;

a third transistor having a collector, a base and an emitter, said collector of said third transistor coupled to a first supply voltage terminal, said base of said third transistor coupled to said collector of said first transistor, said emitter of said third transistor coupled for providing said first summed voltage;

a fourth transistor having a collector, a base and an emitter, said collector of said fourth transistor coupled to said first supply voltage terminal, said base of said fourth transistor coupled to said collector of said second transistor, said emitter of said fourth transistor coupled for providing said second summed voltage;

a first resistor coupled between said collector of said first transistor and said first supply voltage terminal;

a second resistor coupled between said collector of said second transistor and said first supply voltage terminal;

a first current source coupled between said emitters of said first and second transistors and a second supply voltage terminal;

a second current source coupled between said emitter of said third transistor and said second supply voltage terminal; and a third current source coupled between said emitter of said fourth transistor and said second supply voltage terminal.

5. A switchable constant gain summer circuit, comprising:

first means responsive to a plurality of control signals for providing first and second voltages;

a plurality of switched amplifier circuits respectively responsive to a plurality of input signals, each one of said plurality of switched amplifier circuits having a control input and common first and second outputs for respectively providing first and second output signals, each one of said plurality of switched amplifier circuits amplifying a corresponding input signal and providing corresponding amplified signals to said common first and second outputs when said first means applies a first voltage to said control input, each one of said plurality of switched amplifier circuits providing a predetermined current to said common first and second outputs when said first means applies a second voltage to said control input, a gain of each one of said plurality of switched amplifier circuits being independent of a current flowing through another of the plurality of amplifier circuits, and wherein each one of said plurality of switched amplifier circuits includes:

first and second emitter coupled transistors, a collector of said first transistor coupled to a collector of said second transistor both of which are coupled to said common first outputs, a base of said first transistor coupled to receive a first input signal, a base of said second transistor coupled to said first means which alternately, provide said first and second voltages thereat;

third and fourth emitter coupled transistors, a collector of said third transistor coupled to a collector of said fourth transistor both of which are coupled to said common second output, a base of said third transistor coupled to said base of said second transistor, a base of said fourth transistor coupled for receiving an inversion of said first input signal; and a current source coupled between emitters of said first, second, third and fourth transistors and a first supply voltage terminal;

a load circuit coupled to said common first and second outputs of said plurality of switched amplifier circuits wherein a DC bias through said load circuit is substantially constant and independent of whether said first or second voltage is applied to said control inputs of said plurality of amplifier circuits; and an output stage coupled to said common first and second outputs of said plurality of switched amplifier circuits for respectively providing first and second summed voltages.

* * * * *

UNITED STATES PATENT AND TRADEMARK OFFICE
CERTIFICATE OF CORRECTION

PATENT NO. : 5,502,413
DATED : March 26, 1996
INVENTOR(S) : Gary L. Stuhlmiller

It is certified that error appears in the above-indentified patent and that said Letters Patent is hereby corrected as shown below:

In claim 1, column 5, line 38, delete first occurrence of "said".

In claim 2, column 5, line 63, insert --and-- between "first second".

In claim 3, column 6, line 66, insert --and-- in front of "second".

Signed and Sealed this

Fifteenth Day of April, 1997

Attest:

BRUCE LEHMAN

Attesting Officer

Commissioner of Patents and Trademarks